United States Patent
Gates et al.

[11] Patent Number: 6,085,005
[45] Date of Patent: Jul. 4, 2000

[54] OPTICAL ASSEMBLY WITH A COATED COMPONENT

[75] Inventors: John VanAtta Gates, New Providence; Dirk Joachim Muehlner, Berkeley Heights, both of N.J.

[73] Assignee: Lucent Technologies, Inc., Murray Hill, N.J.

[21] Appl. No.: 09/031,033

[22] Filed: Feb. 26, 1998

[51] Int. Cl.[7] .............................. G02B 6/42; G02B 6/12
[52] U.S. Cl. .................................. 385/88; 385/92; 385/14
[58] Field of Search ......................... 385/14–15, 49, 385/88–94, 147, 132; 427/163.2; 359/885

[56] References Cited

U.S. PATENT DOCUMENTS

| | | | |
|---|---|---|---|
| 4,945,400 | 7/1990 | Blonder et al. | 256/116 |
| 5,430,298 | 7/1995 | Possin et al. | 250/370.11 |
| 5,513,288 | 4/1996 | Mayer | 385/30 |
| 5,663,821 | 9/1997 | Suda et al. | 359/152 |
| 5,745,231 | 4/1998 | Groger et al. | 356/128 |
| 5,757,013 | 5/1998 | Groger et al. | 250/458.1 |
| 5,778,127 | 7/1998 | Gilliland et al. | 385/92 |
| 5,780,875 | 7/1998 | Tsuji et al. | 385/92 |
| 5,793,912 | 8/1998 | Boord et al. | 385/37 |
| 5,818,990 | 10/1998 | Steijer et al. | 385/49 |

*Primary Examiner*—John D. Lee
*Assistant Examiner*—Juliana K. Kang

[57] ABSTRACT

An improved optical assembly includes a platform which mounts a plurality of optical components operating at multiple wavelengths of light. At least one of the optical components is coated with a filter layer which absorbs stray light generated by the other optical components. The filter layer substantially reduces crosstalk in the optical assembly.

14 Claims, 1 Drawing Sheet

OPTICAL ASSEMBLY WITH A COATED COMPONENT

FIELD OF THE INVENTION

This invention relates to optical assemblies and, in particular, to an optical assembly having optical components coated with a filter layer to absorb stray wavelengths of light.

BACKGROUND OF THE INVENTION

Multi-channel optical systems carry large quantities of information across great distances. The information may comprise video images, sound, and various types of data. Each channel of the system operates at a specific wavelength of light to transmit and/or receive a selected portion of the information.

Multi-channel optical systems typically include separately packaged optical assemblies such as lasers, photodetectors, turning mirrors, etc. Each optical assembly includes a single optical component mounted on a platform which is enclosed in a housing that optically isolates the component from the other optical assemblies of the system. Accordingly, scattered light generated by the laser or turning mirrors, for example, is not received by the other optical assemblies of the system. This results in relatively low crosstalk between the channels of the system.

In order to reduce the cost and complexity of these optical systems, more recent designs mount the lasers, the photodetectors, the turning mirrors, etc., on a single platform. This, in turn, allows a single housing to be used for enclosing several optical components.

One problem in mounting multiple optical components into a single package is that scattered light generated by one or more of the components may be undesirably received by the other components. This results in unacceptable levels of crosstalk between the channels which substantially degrades the operation of the optical assembly.

SUMMARY OF THE INVENTION

An improved optical assembly includes a platform which mounts a plurality of optical components. At least one of the optical components is coated with a filter layer which absorbs stray light generated by the other optical components.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION OF THE INVENTION

Figure 1:
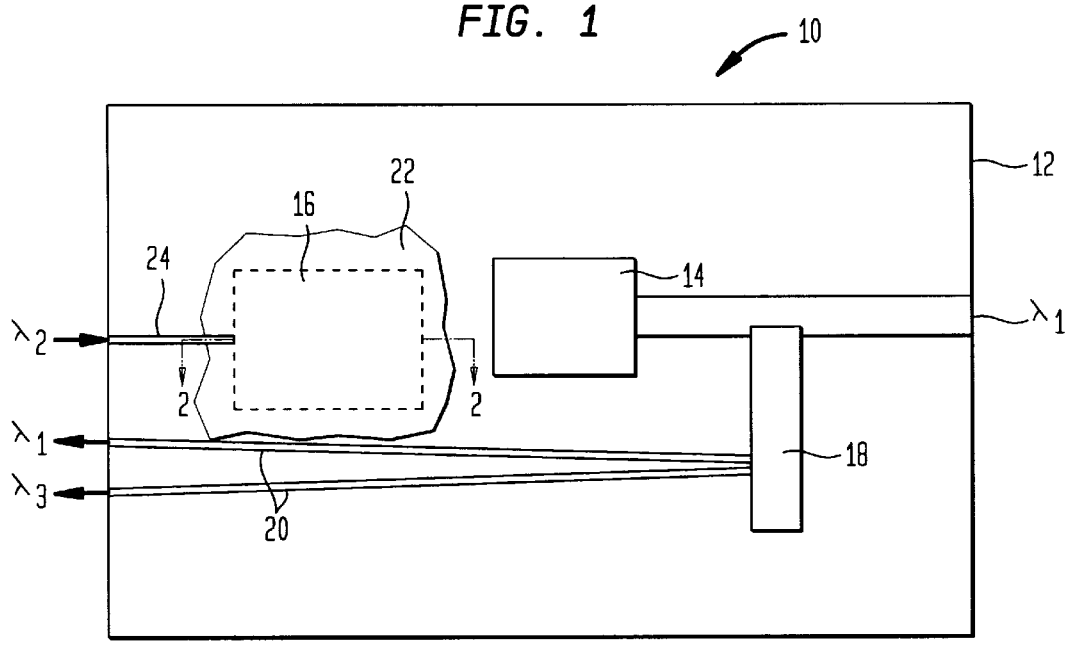
FIG. 1 is a plan view of an optical assembly fabricated according to the present invention.

FIG. 1 is a plan view of an optical assembly 10 fabricated according to an embodiment of the present invention. The optical assembly 10 includes a platform 12 for supporting various active and passive optical components and for providing electrical connections thereto. Such an optical assembly serves multiple channels for transmitting and receiving information. The platform 12 is preferably a semiconductor substrate material, such as silicon or gallium arsenide, in which features may be formed using known deposition and photolithographic techniques.

In the embodiment of FIG. 1, the active and passive optical components supported by the platform can typically include a laser 14, a photodetector 16, a turning mirror 18, and a plurality of passive optical waveguides 20. The laser 14 can generate source light at wavelength $\lambda_1$, the photodetector can detect light at $\lambda_2$, and the turning mirror 18 can couple pass-through light at $\lambda_3$ and light $\lambda_1$ into optical waveguides 20 which perform WDM separation, splitting and/or general routing of light. One or more of the active and passive optical components of the optical assembly may be coated with a filter layer that absorbs stray wavelengths of light not intended for that component. In the embodiment shown in FIG. 1, the photodetector 16 is coated with a filter layer 22.

The filter layer 22 preferably includes a two part adhesive material which contains a black or dark-colored, light-absorbing material. This adhesive material is commercially available from NUFIL under part no. R-2186-2. The filter layer 22 may also include a carbon black absorbing material in a room-temperature-vulcanized (RTV) silicone base which absorbs all wavelengths of light. The RTV silicone-based filter layer 22 also functions as a protective moisture barrier for enhancing the reliability of the optical components. The filter layer 22 may be applied to one or more of the optical components using conventional dispensing techniques.

Other embodiments of the filter layer 22 may include a material which absorbs only one or more selected wavelengths of light. The filter layer 22 may also comprise a plurality of filter layers each having a material which absorbs a particular wavelength of light. Accordingly, a component coated with a filter layer having a wavelength selectable material would still receive wavelengths of light not absorbed by the layer.

Figure 2:
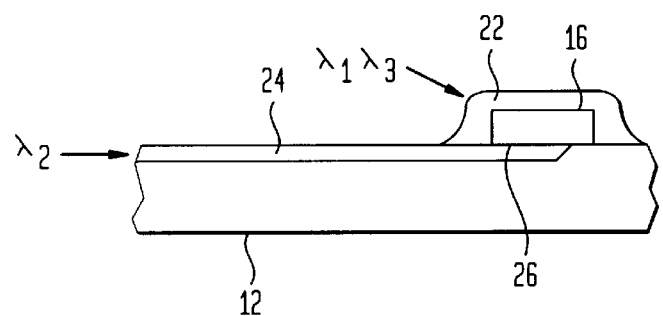
FIG. 2 is a cross-sectional view through line 2—2 of FIG. 1.

FIG. 2 is a cross-sectional view through line 2—2 of FIG. 1. As shown, the filter layer 22 conforms to all the surfaces of the coated component which extend above the surface of the platform 12. In the case of the coated photodetector 16, the filter layer 22 does not coat the primary light admitting surface 26 of the photodetector 16. The light admitting surface 26 faces a waveguide 24 defined in the surface of the platform 12 which extends partially under the photodetector 16 to route light $\lambda_2$ to the photodetector 16. Accordingly, when the filter layer 22 includes a material which absorbs all wavelengths of light, only light $\lambda_2$ transmitted along the waveguide 24 impinges the photodetector 16. The filter layer 22 absorbs the stray wavelengths of light $\lambda_3$ and $\lambda_1$ which scatter off the turning mirror or scatter from the laser. The filter layer 22 advantageously provides greater than 45 dB of optical isolation between the channels of a typical multi-channel optical assembly.

As already mentioned, the other optical components of the assembly, such as the laser 14 and turning mirror 18 may also be coated with the filter layer to further minimize optical crosstalk between channels. When the filter layer is RTV-based, the filter layer may also provide the laser 14 and the turning mirror 18 with moisture barrier protection for enhancing their reliability.

Figure 3:
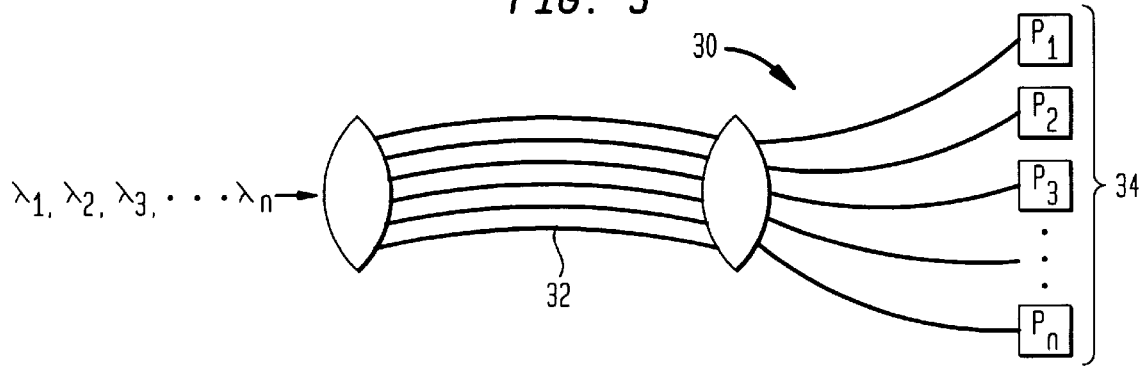
FIG. 3 depicts the architecture a second optical assembly fabricated according to the present invention.

The filter layer may be advantageously applied to any integrated /hybrid optical assembly transmitting and/or receiving multiple wavelengths of light in a single package. FIG. 3 illustrates the architecture of such an optical assembly 30. The optical assembly 30 includes a router 32 which couples different wavelengths of light $\lambda_1, \lambda_2, \lambda_3 \ldots \lambda_n$ into an array 34 of photodetectors $P_1, P_2, P_3 \ldots P_n$. Each of the photodetectors in the array 34 is coated with a filter layer which absorbs stray wavelengths of light.

It is understood that the above-described embodiments illustrate only some of the many possible specific embodiments which can represent applications of the principles of the invention. Numerous modifications and changes can be made by those skilled in the art without departing from the spirit and scope of the invention.

What is claimed is:

1. An optical assembly comprising:

a platform having a surface;

a plurality of optical components operating at different wavelengths of light, mounted on the surface of the platform and enclosed within a common housing; and a filter layer comprising an adhesive material including a light absorbing material covering at least one of the optical components for protecting the component from moisture and for absorbing stray wavelengths of light from the other optical components.

2. The assembly according to claim 1, wherein the at least one optical component coated with the filter layer includes a photodetector.

3. The assembly according to claim 2, wherein the other optical components include optical waveguides defined in the surface of the platform.

4. The assembly according to claim 3, wherein one of the optical waveguides routes a desired wavelength of light into the photodetector through an uncoated surface thereof.

5. The assembly according to claim 2, wherein the other optical components include active and passive optical components.

6. The assembly according to claim 2, wherein the other optical components include a laser.

7. The assembly according to claim 2, wherein the other optical components include a turning mirror.

8. The assembly according to claim 2, wherein the filter layer coats the other optical components.

9. The assembly according to claim 2, wherein the photodetector is a member of an array of photodetectors, each of photodetector of the array being coated by the filter layer.

10. The assembly according to claim 1, wherein the filter layer includes a room-temperature-vulcanizing base material.

11. The assembly according to claim 1, wherein the filter layer includes a material which absorbs all wavelengths of light.

12. The assembly according to claim 1, wherein the filter layer includes a material which absorbs at least one selected wavelength of light.

13. The assembly according to claim 1, wherein the plurality of optical components include active and passive optical components.

14. The assembly according to claim 1, wherein the filter layer includes an adhesive material which absorbs all wavelengths of light.

* * * * *